(12) United States Patent
Yang (10) Patent No.: US 8,692,699 B2
(45) Date of Patent: Apr. 8, 2014

(54) DATA INTERFACE CLOCK GENERATION

(75) Inventor: Wei-Lien Yang, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/545,275

(22) Filed: Jul. 10, 2012

(65) Prior Publication Data

US 2014/0015581 A1 Jan. 16, 2014

(51) Int. Cl.
*H03M 9/00* (2006.01)

(52) U.S. Cl.
USPC .......................................... 341/101; 341/100

(58) Field of Classification Search
USPC .......... 341/101, 100; 375/362, 295, 296, 219, 375/293; 714/710
See application file for complete search history.

(56) References Cited

U.S. PATENT DOCUMENTS

| 5,267,269 | A * | 11/1993 | Shih et al. ............. 375/296 |
| 2001/0031027 | A1 | 10/2001 | Lindsay |
| 2005/0180499 | A1 | 8/2005 | Hsu |
| 2005/0193290 | A1 * | 9/2005 | Cho et al. ............. 714/710 |
| 2010/0183108 | A1 | 7/2010 | Shin |
| 2011/0102041 | A1 | 5/2011 | Froidevaux |

FOREIGN PATENT DOCUMENTS

KR 10-2010-004721 5/2010

OTHER PUBLICATIONS

International Searching Authority, "Notification of Transmittal of the International Search Report and the Written Opinion of the International Searching Authority," mailed Oct. 21, 2013, in International application No. PCT/US2013/048085.

* cited by examiner

*Primary Examiner* — Joseph Lauture
(74) *Attorney, Agent, or Firm* — Trop, Pruner & Hu, P.C.

(57) ABSTRACT

In one embodiment, an apparatus may include a clock generator to generate a format clock signal. The apparatus may also include a serializer to generate serial data based on a transmit clock signal and parallel input data. The apparatus may also include a signal generator to generate at least two differential signals based on the format clock signal and the serial data.

24 Claims, 9 Drawing Sheets

DATA INTERFACE CLOCK GENERATION

BACKGROUND

Embodiments relate generally to data interfaces for electronic devices.

Many electronic devices include multiple components coupled together by one or more data interfaces. For example, a cellular telephone may include a processor core coupled to a radio transceiver, a sound input device, a sound output device, a camera, a display device, a memory device, etc. The functionality of such components has been continually improved to meet market demands. Accordingly, the data interfaces between the components may need to be adapted to such functionality.

DETAILED DESCRIPTION

In accordance with some embodiments, electronic devices may use differential pulse width modulated (PWM) signals to transmit data between components. In one or more embodiments, a format clock signal may be generated based on a gear selection input. In some embodiments, a transmit clock signal may be generated based on the format clock signal. Further, in some embodiments, the format clock signal may be used to align the timing of differential PWM signals. In one or more embodiments, such alignment of the differential PWM signals may facilitate recovery of PWM data bits by a receiver.

Figure 1:
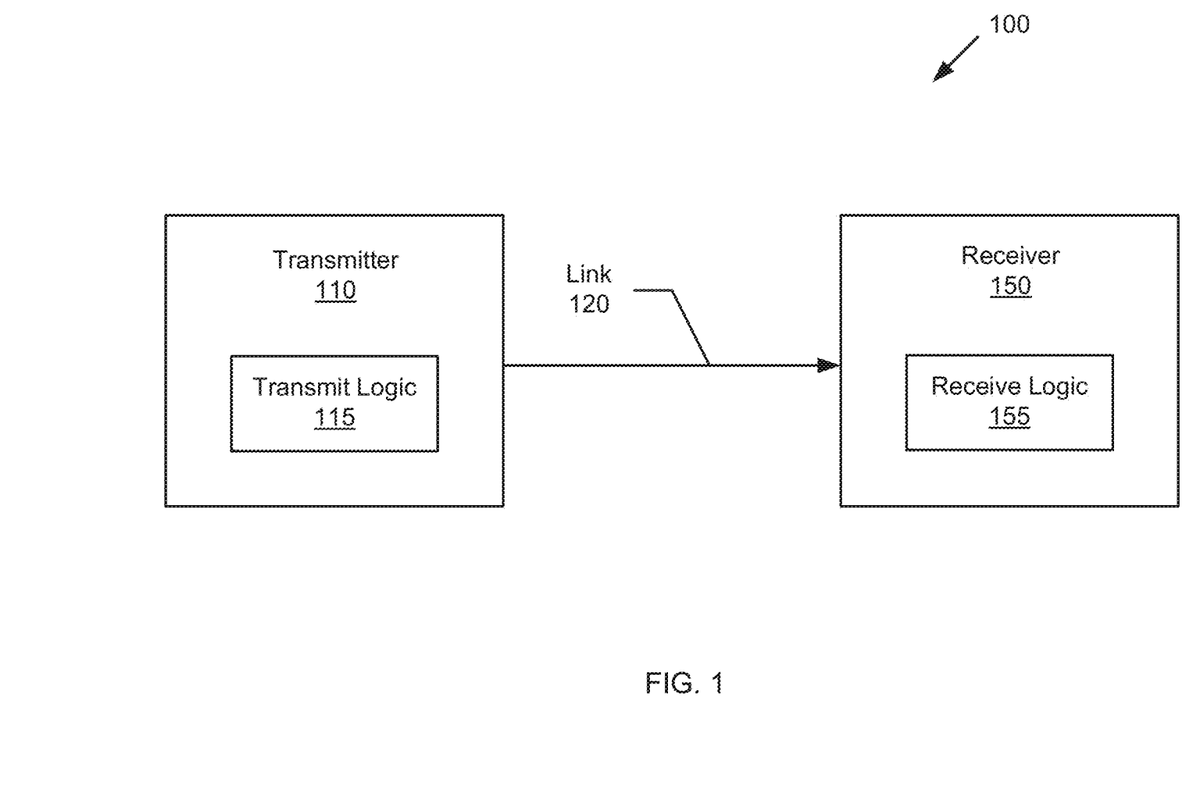
FIG. 1 is a block diagram of a system in accordance with one or more embodiments.

Referring to FIG. 1, shown is a block diagram of an apparatus 100 in accordance with one or more embodiments. As shown in FIG. 1, the apparatus 100 may include a link 120 connecting a transmitter 110 and a receiver 150. In accordance with some embodiments, the apparatus 100 may be any electronic device, such as a cellular telephone, a computer, a media player, a network device, etc.

In some embodiments, the transmitter 110 and the receiver 150 may exist to connect any components or peripherals of the apparatus 100, such as a processor, a processor core, a memory device, a display device, a sound device, a wireless transceiver, a camera, etc. Note that, while only one pair of transmitter 110 and receiver 150 is shown for the sake of clarity, the example shown in FIG. 1 is not intended to be limiting. Accordingly, it should be appreciated that any number of such transmitter-receiver pairs may exist to connect various components of the apparatus 100.

In accordance with some embodiments, the link 120 may be any electrical or data connection(s) (e.g., motherboard connection, input/output cable, network connector, bus, wireless link, etc.). In one or more embodiments, the transmitter 110 may include transmit logic 115 to manage data connections to the receiver 150. Further, in some embodiments, the receiver 150 may include receive logic 155 to manage the data connections from the transmitter 110.

In accordance with some embodiments, the link 120, the transmit logic 115, and the receive logic 155 may use one or more data interface protocols. For example, in some embodiments, the link 120, the transmitter 110, and the receiver 150 may use the M-PHY specification of the Mobile Industry Processor Interface (MIPI) Alliance (MIPI Specification for M-PHY Version 1.00.00 of Feb. 8, 2011, approved Apr. 28, 2011). In such embodiments, the link 120 may include serial lines carrying differential PWM signals. Optionally, such differential signals may be referred to as "self-clocking" if clock information is included in the period of the differential signal waveform.

In one or more embodiments, the differential PWM signals of the link 120 may operate under one or more data rate ranges of the M-PHY specification (referred to as "gears"). For example, the link 120 may operate under gear 1 (3 Mbps to 9 Mbps), gear 2 (6 Mbps to 18 Mbps), gear 3 (12 Mbps to 36 Mbps), gear 4 (24 Mbps to 72 Mbps), gear 5 (48 Mbps to 144 Mbps), gear 6 (96 Mbps to 288 Mbps), gear 7 (192 Mbps to 576 Mbps), etc.

In accordance with some embodiments, the transmit logic 115 may include functionality to convert parallel data into differential PWM signals. Further, the transmit logic 115 may also include functionality to generate a format clock signal to format the differential PWM signals. In addition, the transmit logic 115 may also include functionality to generate a transmit clock signal based on the format clock signal. This functionality of the transmit logic 115 is described further below with reference to FIGS. 2-5.

In one or more embodiments, the transmit logic 115 and/or the receive logic 155 may be implemented in hardware, software, and/or firmware. In firmware and software embodiments, they may be implemented by computer executed instructions stored in a non-transitory computer readable medium, such as an optical, semiconductor, or magnetic storage device. While shown with this particular implementation in the embodiment of FIG. 1, the scope of the various embodiments discussed herein is not limited in this regard.

Figure 2:
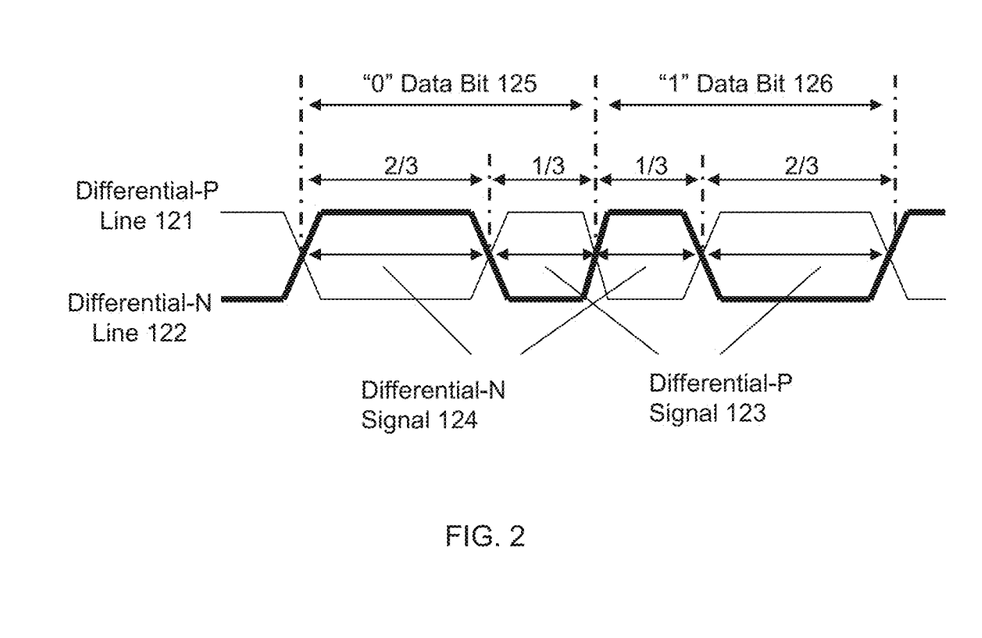
FIG. 2 is an example timing diagram in accordance with one or more embodiments.

Referring to FIG. 2, shown is a timing chart of a system in accordance with one or more embodiments. The timing chart shows an example of power states (i.e., voltage levels) of differential-p line 121 and differential-n line 122 with respect to time. In some embodiments, the differential lines 121 and 122 may transport differential PWM signals 123, 124, and may together correspond generally to the link 120 shown in FIG. 1.

In one or more embodiments, the transmit logic 115 (shown in FIG. 1) may generate the differential PWM signals 123, 124 based on parallel data. Further, in some embodiments, the receive logic 155 (shown in FIG. 1) may sample the differential lines 121 and 122 for a designated time period to determine how the transferred data (e.g., a single PWM data bit) may be expressed. For example, as shown, the differential-p signal 123 may be expressed when the differential-p line 121 is in a high power state and the differential-n line 122 is in a low power state. Similarly, the differential-n signal 124 may be expressed when the differential-n line 122 is in a high power state and the differential-p line 121 is in a lower power state.

In addition, in one or more embodiments, the PWM data bit may be defined by the relative duration of the differential signals 123, 124 during the PWM data bit time period. In some embodiments, the relative duration of the differential signals 123, 124 may be defined in terms of equal portions of the PWM data bit time period. Further, the number of the equal portions may be expressed as a predetermined multiple (e.g., 2, 3, 4, etc.). For example, assume that the predetermined multiple is three. Thus, in this example, the duration of the differential signals 123, 124 is defined in terms of one-third portions of the PWM data bit time period. This example may be illustrated in FIG. 2 in accordance with some embodiments. As shown, a "0" data bit 125 may be expressed when the differential-n signal 124 corresponds to two-thirds of the PWM data bit period, and the differential-p signal 123 corresponds to the remaining one-third of the PWM data bit period. Further, as shown, a "1" data bit 126 may be expressed when the differential-n signal 124 corresponds to one-third of the PWM data bit period, and the differential-p signal 123 corresponds to the remaining two-thirds of the PWM data bit period. Note that, while the example shown in FIG. 2 assumes a predetermined multiple of three, embodiments are not limited in this regard. In some embodiments, the predetermined multiple may be defined in accordance to a given standard or specification (e.g., the M-PHY specification).

Figure 3A:
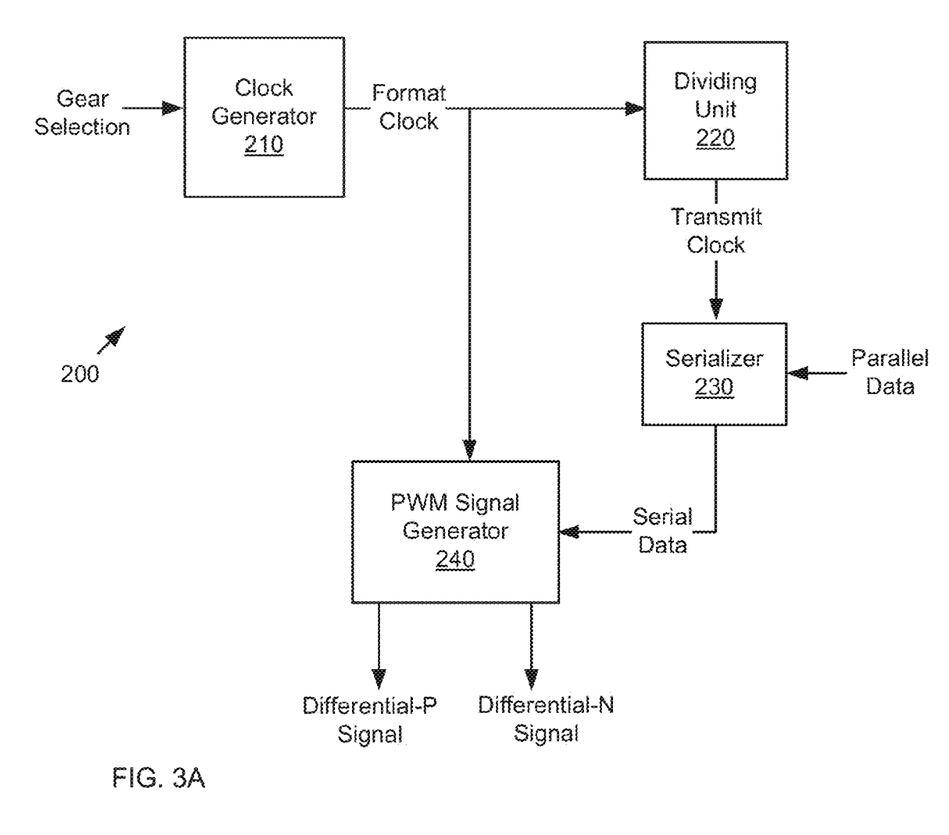
FIG. 3A is a block diagram of a system in accordance with one or more embodiments.

Referring to FIG. 3A, shown is a block diagram of a signal generation logic 200 in accordance with one or more embodiments. More specifically, the signal generation logic 200 may generally correspond to all or a portion of the transmit logic 115 shown in FIG. 1. In some embodiments, the signal generation logic 200 may include a clock generator 210, a dividing unit 220, a serializer 230, and a PWM signal generator 240.

As shown, in one or more embodiments, the clock generator 210 may receive a gear selection input. In one or more embodiments, the gear selection input may be any identifier or indication to identify any one of a number of gears (i.e., data rate ranges). In some embodiments, the gear selection input may be one of the seven gears as defined by the M-PHY specification.

In one or more embodiments, the clock generator 210 may include functionality to select a transmit clock rate based on the gear selection input. For example, assume that the gear selection input corresponds to gear 1 (i.e., 3-9 Mbps). In some embodiments, the clock generator 210 may set the transmit clock rate as corresponding to the lower bound of gear 1 (i.e., 3 MHz), to the upper bound of gear 1, (i.e., 9 MHz), to the mid-point of gear 1 (i.e., 6 MHz), or to any other level or value within gear 1.

Further, in one or more embodiments, the clock generator 210 may include functionality to generate a format clock signal having a frequency that is the predetermined multiple (e.g., 3×) of the selected transmit clock rate. For example, assuming that the selected transmit clock rate is 6 MHz and the predetermined multiple is three, the clock generator 210 may generate a format clock signal having a frequency of 18 MHz (i.e., three times faster than 6 MHz). In some embodiments, the clock generator 210 may include a delay locked loop (DLL), a phase locked loop (PLL), and/or any similar components. Of course, while this example assumes a predetermined multiple of three, embodiments are not limited in this regard.

As shown, the format clock signal may be provided to the dividing unit 220 and the PWM signal generator 240. In one or more embodiments, the dividing unit 220 may include functionality to divide a frequency of the format clock signal by the predetermined multiple to obtain a transmit clock signal. For example, in the case that the format clock signal has a frequency of 18 MHz and the predetermined multiple is three, the dividing unit 220 may provide a transmit clock signal having a frequency of 6 MHz. One example embodiment of the dividing unit 220 is described below with reference to FIG. 3B.

In one or more embodiments, one pulse of the transmit clock signal may correspond to a single PWM data bit time period (e.g., the "0" data bit 125 or the "1" data bit 126 shown in FIG. 2). Note that the time duration of one pulse of the format clock signal is equal to the time duration of a pulse of the transmit clock signal divided by the predetermined multiple. Accordingly, one pulse of the format clock signal may correspond to the PWM data bit time period divided by the predetermined multiple.

In accordance with some embodiments, the transmit clock signal and parallel input data may be provided to the serializer 230. In one or more embodiments, the serializer 230 may include functionality to convert the parallel input data into serial data. For example, in some embodiments, the serializer 230 may include a Parallel-In, Serial-Out (PISO) component. Further, in one or more embodiments, the serializer 230 may perform this conversion such that the resulting serial data bits are synchronized to the transmit clock signal. In some embodiments, the parallel input data may be any parallel data to be transmitted to a receiver (e.g., receiver 150 shown in FIG. 1).

As shown, in one or more embodiments, the serial data may be provided to the PWM signal generator 240. In one or more embodiments, the PWM signal generator 240 may include functionality to convert the serial data into differential PWM signals (e.g., differential signals 123, 124 shown in FIG. 2).

In one or more embodiments, the PWM signal generator 240 may use the format clock signal to define the timing of the generated differential signals. Specifically, as described above, each pulse of the format clock signal may correspond to the PWM data bit time period divided by the predetermined multiple. Thus, assuming a predetermined multiple of three, in order to convert a "0" value serial data bit into differential PWM form, the PWM signal generator 240 may generate a differential-n signal for two pulses of the format clock signal (i.e., for the first two-thirds of the PWM data bit period), and may then generate a differential-p signal for one pulse of the format clock signal (i.e., for the remaining one-third of the PWM data bit period). Further, in order to convert a "1" value serial data bit into differential PWM form, the PWM signal generator 240 may generate a differential-n signal for one pulse of the format clock signal (i.e., for the first one-third of the PWM data bit period), and may then generate a differential-p signal for two pulses of the format clock signal (i.e., for the remaining two-thirds of the PWM data bit period). In this manner, the timing of the differential signals generated by the PWM signal generator 240 may be aligned to the PWM data bit period. In one or more embodiments, such alignment of the differential signals may facilitate recovery of the PWM data bits by the receiver. While the above example assumes a predetermined multiple of three, embodiments are not limited in this regard.

Figure 3B:
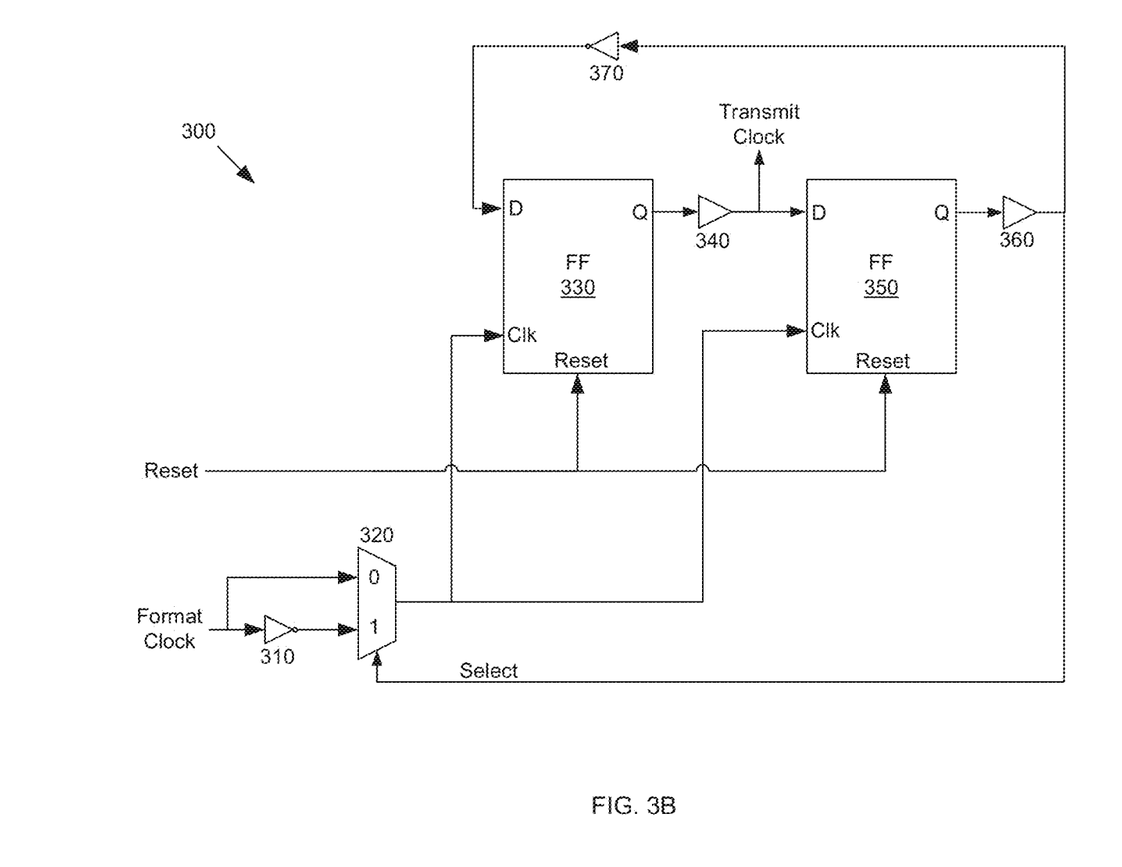
FIG. 3B is a block diagram of a system in accordance with one or more embodiments.

Referring now to FIG. 3B, shown is a block diagram of a dividing logic 300 in accordance with one or more embodiments. More specifically, in some embodiments, the dividing logic 300 may generally correspond to all or part of the dividing unit 220 shown in FIG. 3A. Further, the dividing logic 300 may correspond to a situation in which the predetermined multiple of three.

As shown, the dividing logic 300 may receive a format clock signal. In one or more embodiments, the format clock signal may be provided by a clock generator (e.g., clock generator 210 shown in FIG. 3A). In some embodiments, each pulse of the format clock signal may correspond to one-third of a single PWM data bit time period.

As shown in FIG. 3B, in one or more embodiments, the format clock signal may be provided to a first inverter 310. The format clock signal may also be provided, along with an output of the first inverter 310, to inputs of a 2-to-1 multiplexer 320. As shown, the output of the 2-to-1 multiplexer 320 may be provided to clock inputs of a first flip flop (FF) 330 and a second FF 350. Further, a reset signal may be coupled to the reset inputs of the first FF 330 and the second FF 350. In one or more embodiments, the reset signal may be provided by a processor (not shown) to initiate a PWM signaling process.

As shown, in one or more embodiments, the output of the first FF 330 may be provided to a buffer 340. In some embodiments, the output of the buffer 340 may be a transmit clock signal. In one or more embodiments, this transmit clock signal may be provided to a serializer (e.g., serializer 230 shown in FIG. 3A) for use in serializing parallel data. In one or more embodiments, each pulse of the transmit clock signal may correspond to a single PWM data bit time period.

In accordance with some embodiments, the output of the buffer 340 may also be provided to a data input of the second FF 350. The output of the second FF 350 may be coupled to a second buffer 360. Further, the output of the second buffer 360 may be provided to a second inverter 370. As shown, the output of the second inverter 370 may be coupled to a data input of the first FF 330. Further, in one or more embodiments, the output of the second buffer 360 may also be provided to a selector input of the 2-to-1 multiplexer 320.

In one or more embodiments, the dividing logic 300 shown in FIG. 3B may provide a transmit clock signal having a pulse time period three times longer than the pulse time period of the received format clock signal. Accordingly, in some embodiments, the dividing logic 300 may enable generation of differential PWM signals having precise one-third portions.

Note that the examples shown in FIGS. 1, 2, 3A, and 3B are provided for the sake of illustration, and are not intended to limit any embodiments. For example, referring to FIG. 1, embodiments may include any number and/or arrangement of transmitters 110 and/or receivers 150. In another example, referring to FIG. 3A, the signal generation logic 200 may include additional and/or different components to provide differential PWM signals. In yet another example, referring to FIG. 3B, the dividing logic 300 may include additional and/or different components to provide a transmit clock signal based on a format clock signal. While some of the examples shown in FIGS. 1, 2, 3A, and 3B assume a predetermined multiple of three, embodiments are not limited in this regard.

It is contemplated that some embodiments may include any number of components in addition to those shown, and that different arrangement of the components shown may occur in certain implementations. Further, it is contemplated that specifics in the examples shown in FIGS. 1, 2, 3A, and 3B may be used anywhere in one or more embodiments.

Figure 4:
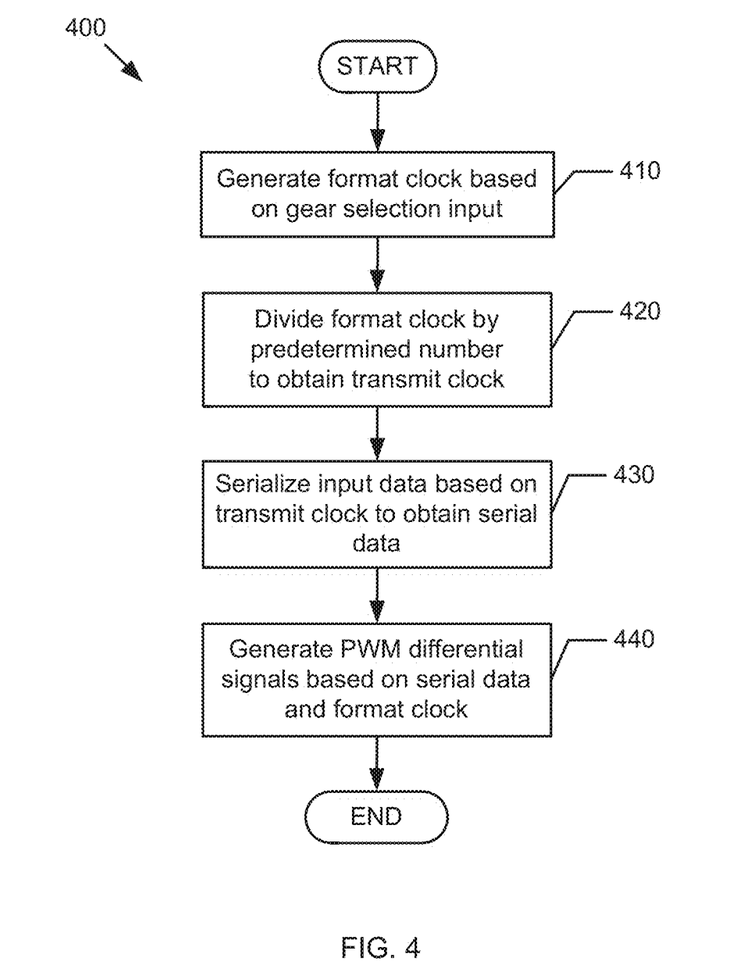
FIG. 4 is a flow chart of a method in accordance with one or more embodiments.

FIG. 4 shows a sequence 400 for generating differential signals in accordance with one or more embodiments. In one embodiment, the sequence 400 may be part of the transmit logic 115 shown in FIG. 1. In other embodiments, the sequence 400 may be implemented by any other part of transmitter 110. The sequence 400 may be implemented in hardware, software, and/or firmware. In firmware and software embodiments it may be implemented by computer executed instructions stored in a non-transitory computer readable medium, such as an optical, semiconductor, or magnetic storage device.

At step 410, a format clock signal may be generated based on a gear selection input. For example, referring to FIG. 3A, the clock generator 210 may receive a gear selection input (e.g., gear 1), and may select a transmit clock rate based on the gear selection input. The clock generator 210 may then generate a format clock signal having a frequency that is a predetermined multiple (e.g., 2×, 3×, 4×, etc.) of the selected transmit clock rate. In some embodiments, the clock generator 210 may include a delay locked loop (DLL), a phase locked loop (PLL), and/or any similar components.

At step 420, the format clock signal (generated at step 410) may be divided by the predetermined multiple to obtain a transmit clock signal. For example, referring to FIG. 3A, the dividing unit 220 may divide the format clock signal (e.g., 18 MHz) by three to obtain the transmit clock signal (e.g., 6 MHz). In one or more embodiments, the dividing unit 220 may include some or all of the dividing logic 300 shown in FIG. 3B.

At step 430, parallel data may be serialized based on the transmit clock signal to obtain serial data. For example, referring to FIG. 3A, the serializer 230 may convert the parallel input data into serial data using the transmit clock signal. In some embodiments, the PWM data bit time period of the resulting serial data bits may be equivalent to a pulse period of the transmit clock signal. In accordance with some embodiments, the serializer 230 may be a PISO unit.

At step 440, differential PWM signals may be generated based on the serial data (obtained at step 430) and the format clock signal (generated at step 410). For example, referring to FIG. 3A, the PWM signal generator 240 may convert serial data into differential PWM signals (e.g., differential signals 123, 124 shown in FIG. 2). In one or more embodiments, the PWM signal generator 240 may use the format clock signal to define equal portions of the PWM data bit time period. In this manner, the PWM signal generator 240 may generate differential PWM signals that are time-aligned to the PWM data bit time period, and may thus enable efficient data recovery by a receiver (e.g., receiver 150 shown in FIG. 1). After step 440, the sequence 400 ends.

Figure 5:
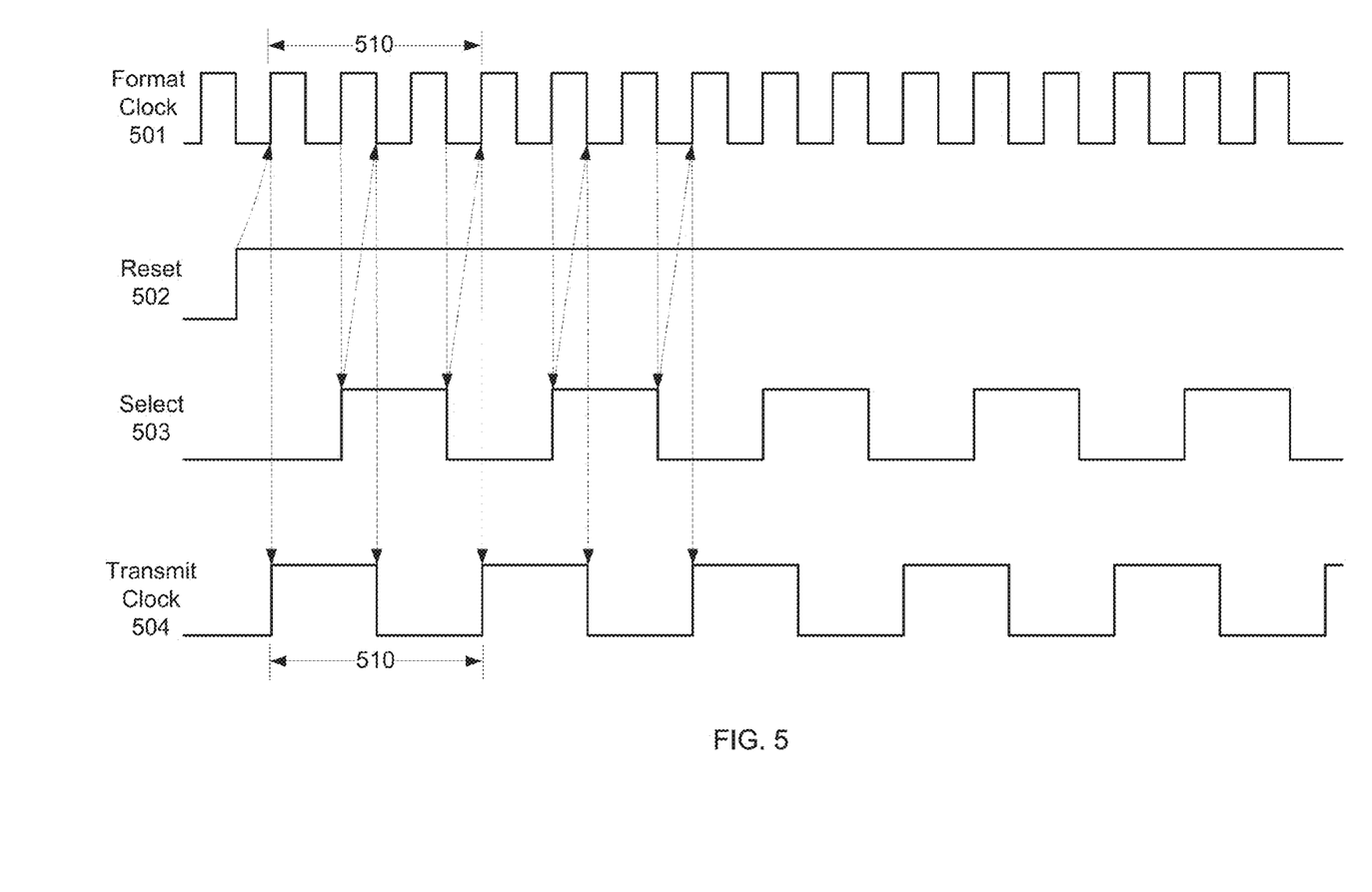
FIG. 5 is an example timing diagram in accordance with one or more embodiments.

Referring now to FIG. 5, shown is a timing diagram of a system in accordance with one or more embodiments. Specifically, the timing diagram may correspond to various signals involved in the systems and processes discussed above with reference to FIGS. 1-4. Further, the timing diagram may correspond to an example in which the predetermined multiple is three.

The first signal shown in FIG. 5 is a format clock signal 501. As discussed above, the format clock signal 501 may be generated based on a gear selection input.

The second signal shown in FIG. 5 is a reset signal 502. In one or more embodiments, the reset signal 502 may be provided by a processor (not shown) to initiate a PWM signaling process.

The third signal shown in FIG. 5 is a select signal 503. For example, referring to FIG. 3B, the select signal 503 may correspond to the output of the buffer 340, and may be provided to a selector input of the 2-to-1 multiplexer 320.

The fourth signal shown in FIG. 5 is a transmit clock signal 504. In one or more embodiments, each pulse of the transmit clock signal 504 may correspond to a single PWM data bit time period. Further, in some embodiments, the transmit clock signal 504 may be generated using the dividing logic 300 shown in FIG. 3B.

In the example shown in FIG. 5, a rising edge in the reset signal 502 may activate the dividing logic 300. After activation, in response to a rising edge of the format clock signal 501, the dividing logic 300 may initiate a first pulse of the transmit clock signal 504. Further, in response to the next rising edge of the format clock signal 501, the dividing logic 300 may initiate a first pulse of the select signal 503. Furthermore, in response to a falling edge of the format clock signal 501, the dividing logic 300 may end the first pulse of the transmit clock signal 504.

Next, in response to another falling edge of the format clock signal 501, the dividing logic 300 may end the first pulse of the select signal 503. Finally, in response to another rising edge of the format clock signal 501, the dividing logic 300 may initiate a second pulse of the transmit clock signal 504. The above-described process may then be repeated to generate subsequent pulses of the transmit clock signal 504.

Note that, in this example shown in FIG. 5, a given time period 510 is equal to a single pulse period (e.g., from rising edge to rising edge) of the transmit clock signal 504. However, in the case of the format clock signal 501, the given time period 510 is equivalent to three pulse periods. While this example assumes a predetermined multiple of three, embodiments are not limited in this regard.

Figure 6:
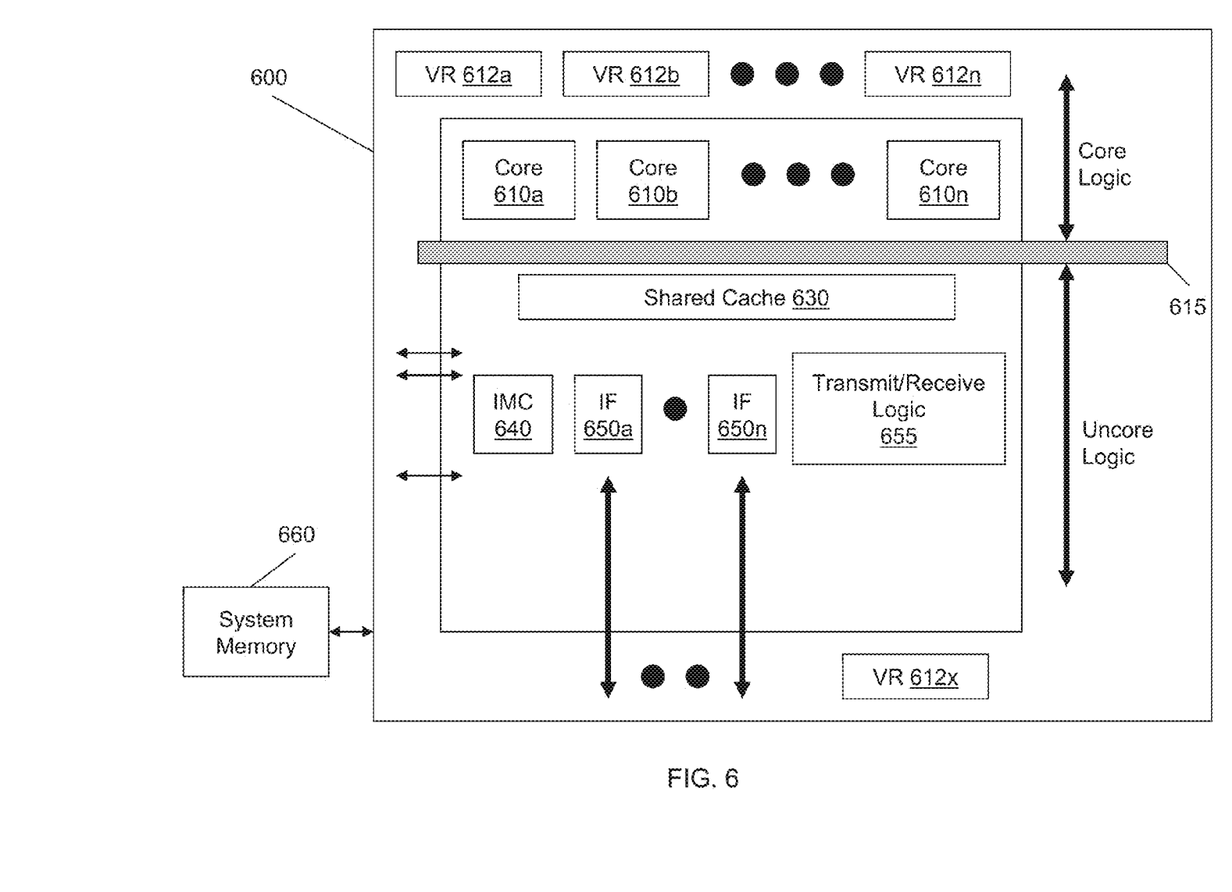
FIG. 6 is a block diagram of a processor in accordance with one or more embodiments.

Referring now to FIG. 6, shown is a block diagram of a processor in accordance with one or more embodiments. As shown in FIG. 6, processor 600 may be a multicore processor including a plurality of cores 610a-610n. Each core may be associated with a corresponding voltage regulator 612a-612n. The various cores may be coupled via an interconnect 615 to an uncore logic that includes various components. As seen, the uncore logic may include a shared cache 630 which may be a last level cache. In addition, the uncore logic may include an integrated memory controller 640, various interfaces 650 and transmit/receive logic 655.

In one or more embodiments, transmit/receive logic 655 may include all or a portion of the signal generation logic 200 and/or the dividing logic 300 described above with reference to FIGS. 3A-3B. Thus, the transmit/receive logic 655 may enable the cores 610a-610n and/or other components (e.g., components included in a mobile computing device) to generate a format clock signal and/or a transmit clock signal in accordance with some embodiments.

With further reference to FIG. 6, processor 600 may communicate with a system memory 660, e.g., via a memory bus. In addition, by interfaces 650, connection can be made to various off-chip components such as peripheral devices, mass storage and so forth. While shown with this particular implementation in the embodiment of FIG. 6, the scope of the various embodiments discussed herein is not limited in this regard.

Figure 7:
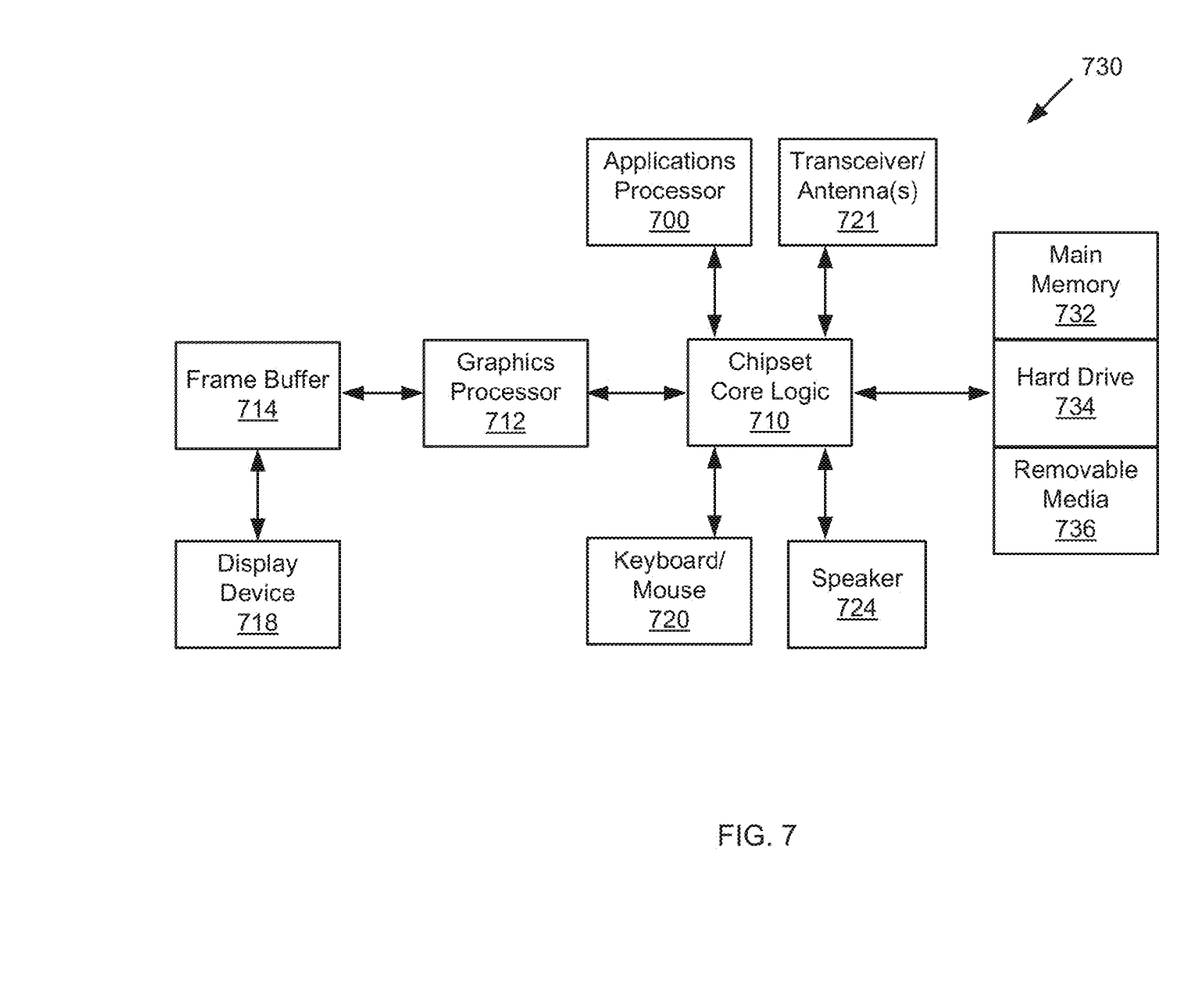
FIG. 7 is a block diagram of an example system in accordance with one or more embodiments.

Embodiments may be used in many different environments. Referring now to FIG. 7, shown is a block diagram of a computer system 730 with which embodiments can be used. The computer system 730 may include a hard drive 734 and a removable storage medium 736, coupled by a bus (shown as an arrow) to a chipset core logic 710. A keyboard and/or mouse 720, or other conventional components, may be coupled to the chipset core logic.

The core logic may couple to the graphics processor 712, and the applications processor 700 in one embodiment. The graphics processor 712 may also be coupled to a frame buffer 714. The frame buffer 714 may be coupled to a display device 718, such as a liquid crystal display (LCD) touch screen. In one embodiment, the graphics processor 712 may be a multi-threaded, multi-core parallel processor using single instruction multiple data (SIMD) architecture.

The chipset logic 710 may include a non-volatile memory port to couple to the main memory 732. Also coupled to the core logic 710 may be a radio transceiver and antenna(s) 721. Speakers 724 may also be coupled to core logic 710.

Figure 8:
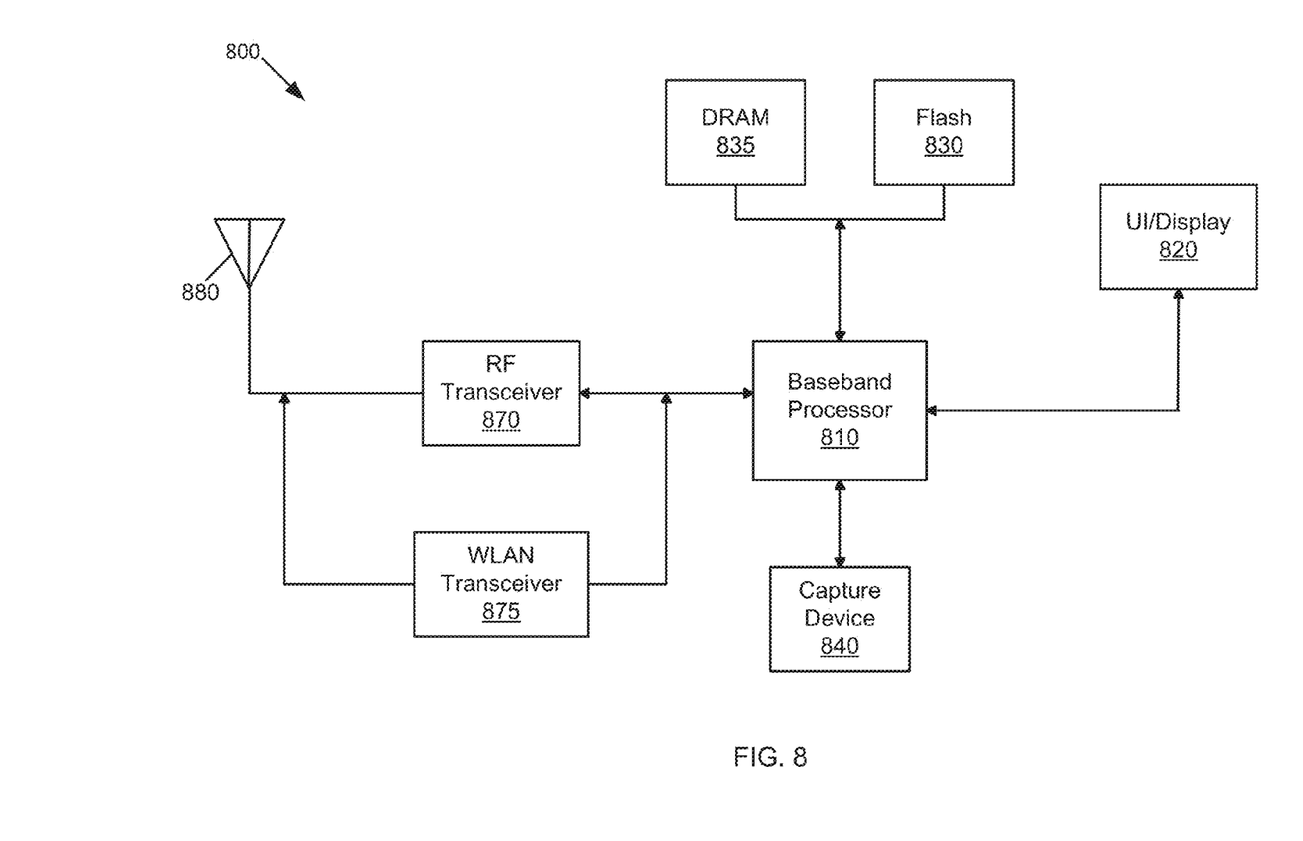
FIG. 8 is a block diagram of an example system in accordance with one or more embodiments.

Referring now to FIG. 8, shown is a block diagram of an example system 800 with which embodiments can be used. As seen, system 800 may be a smartphone or other wireless communicator. As shown in the block diagram of FIG. 8, system 800 may include a baseband processor 810 which may be a multicore processor that can handle both baseband processing tasks as well as application processing. Thus baseband processor 810 can perform various signal processing with regard to communications, as well as perform computing operations for the device. In turn, baseband processor 810 can couple to a user interface/display 820 which can be realized, in some embodiments by a touch screen display.

In addition, baseband processor 810 may couple to a memory system including, in the embodiment of FIG. 8 a non-volatile memory, namely a flash memory 830 and a system memory, namely a dynamic random access memory (DRAM) 835. As further seen, baseband processor 810 can further couple to a capture device 840 such as an image capture device that can record video and/or still images.

To enable communications to be transmitted and received, various circuitry may be coupled between baseband processor 810 and an antenna 880. Specifically, a radio frequency (RF) transceiver 870 and a wireless local area network (WLAN) transceiver 875 may be present. In general, RF transceiver 870 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. Other wireless communications such as receipt or transmission of radio signals, e.g., AM/FM, or global positioning satellite (GPS) signals may also be provided. In addition, via WLAN transceiver 875, local wireless signals, such as according to a Bluetooth™ standard or an IEEE 802.11 standard such as IEEE 802.11a/b/g/n can also be realized. Although shown at this high level in the embodiment of FIG. 8, understand the scope of the present invention is not limited in this regard.

Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

The following clauses and/or examples pertain to further embodiments. One example embodiment may be an apparatus including: a clock generator to generate a format clock signal; a serializer to generate serial data based on a transmit clock signal and parallel input data; and a signal generator to generate at least two differential signals based on the format clock signal and the serial data. The apparatus may also include a dividing unit to obtain the transmit clock signal by dividing a frequency of the format clock signal by a predetermined multiple. The dividing unit may include a multiplexer. The dividing unit may also include at least two flip flops, where clock inputs of the at least two flip flops are each coupled to an output of the multiplexer. A pulse period of the transmit clock signal may be a predetermined multiple of a pulse period of the format clock signal. The serializer may be a Parallel-In, Serial-Out (PISO) unit. The clock generator may be to generate the format clock signal based on a gear selection input. The transmit clock rate may correspond to a midpoint of a gear associated with the gear selection input. The at least two differential input signals may be Pulse Width Modulated (PWM) signals. The PWM signals may be to conform to the Mobile Industry Processor Interface (MIPI) M-PHY Specification. The pulse period of the transmit clock signal may be equal to a PWM data bit time period. The pulse period of the format clock signal may be equal to one-third of a PWM data bit time period. The timing of the at least two differential input signals may be aligned with a pulse period of the format clock signal.

Another example embodiment may be a system including: a system on a chip comprising at least one core having at least one execution unit and transmit logic, the transmit logic including: a clock generator to generate a format clock signal; a dividing unit to obtain a transmit clock signal based on the format clock signal; a serializer to generate serial data based on the transmit clock signal and input data; and a signal generator to generate two or more differential signals based on the format clock signal and the serial data. The system may also include a wireless device coupled to the system on the chip via an interconnect, the interconnect used to communicate data between the wireless device and the transmit logic of the system on the chip. The dividing unit may be to obtain the transmit clock signal by dividing a frequency of the format clock signal by a predetermined multiple. A frequency of the transmit clock signal may be one third a frequency of the format clock signal. The clock generator may be to generate the format clock signal based on a gear selection input. The clock generator may include a delay locked loop (DLL). The clock generator may include a phase locked loop (PLL).

Yet another example embodiment may be a method including: generating, in a transmit logic of a first device, a format clock signal; dividing the format clock signal by a predetermined multiple to obtain a transmit clock signal; serializing parallel data based on the transmit clock signal to obtain serial data; and generating a plurality of differential signals based on the serial data and the format clock signal. Generating the format clock signal may include selecting a transmit clock rate based on the gear selection input. The predetermined multiple may be three. Each of the plurality of differential signals may be a Pulse Width Modulated (PWM) signal. Each of the plurality of differential signals may be to conform to the Mobile Industry Processor Interface (MIPI) M-PHY Specification.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments for the sake of illustration, those skilled in the art will appreciate numerous modifications and variations therefrom. It is intended that the appended claims cover all such modifications and variations as fall within the true spirit and scope of this present invention.

What is claimed is:

1. An apparatus comprising:
a clock generator to generate a format clock signal;
a serializer to generate serial data based on a transmit clock signal and parallel input data; and
a signal generator to generate at least two differential signals based on the format clock signal and the serial data.

2. The apparatus of claim 1, further comprising a dividing unit to obtain the transmit clock signal by dividing a frequency of the format clock signal by a predetermined multiple.

3. The apparatus of claim 2, wherein the dividing unit comprises a multiplexer.

4. The apparatus of claim 3, wherein the dividing unit comprises at least two flip flops, and wherein clock inputs of the at least two flip flops are each coupled to an output of the multiplexer.

5. The apparatus of claim 1, wherein a pulse period of the transmit clock signal is a predetermined multiple of a pulse period of the format clock signal.

6. The apparatus of claim 1, wherein the serializer is a Parallel-In, Serial-Out (PISO) unit.

7. The apparatus of claim 1, wherein the clock generator is to generate the format clock signal based on a gear selection input.

8. The apparatus of claim 7, wherein the transmit clock rate corresponds to a midpoint of a gear associated with the gear selection input.

9. The apparatus of claim 1, wherein the at least two differential input signals are Pulse Width Modulated (PWM) signals.

10. The apparatus of claim 9, wherein the PWM signals are to conform to the Mobile Industry Processor Interface (MIPI) M-PHY Specification.

11. The apparatus of claim 9, wherein a pulse period of the transmit clock signal is equal to a PWM data bit time period.

12. The apparatus of claim 9, wherein a pulse period of the format clock signal is equal to one-third of a PWM data bit time period.

13. The apparatus of claim 1, wherein a timing of the at least two differential signals is aligned with a pulse period of the format clock signal.

14. A system comprising:
a system on a chip comprising at least one core having at least one execution unit and transmit logic, the transmit logic comprising:
a clock generator to generate a format clock signal;
a dividing unit to obtain a transmit clock signal based on the format clock signal;
a serializer to generate serial data based on the transmit clock signal and input data;

a signal generator to generate two or more differential signals based on the format clock signal and the serial data; and a wireless device coupled to the system on the chip via an interconnect, the interconnect used to communicate data between the wireless device and the transmit logic of the system on the chip.

15. The system of claim 14, wherein the dividing unit is to obtain the transmit clock signal by dividing a frequency of the format clock signal by a predetermined multiple.

16. The system of claim 14, wherein a frequency of the transmit clock signal is one third a frequency of the format clock signal.

17. The system of claim 14, wherein the clock generator is to generate the format clock signal based on a gear selection input.

18. The system of claim 14, the clock generator comprising a delay locked loop (DLL).

19. The system of claim 14, the clock generator comprising a phase locked loop (PLL).

20. A method comprising:
generating, in a transmit logic of a first device, a format clock signal;
dividing the format clock signal by a predetermined multiple to obtain a transmit clock signal;
serializing parallel data based on the transmit clock signal to obtain serial data; and
generating a plurality of differential signals based on the serial data and the format clock signal.

21. The method of claim 20, wherein generating the format clock signal comprises selecting a transmit clock rate based on a gear selection input.

22. The method of claim 20, wherein the predetermined multiple is three.

23. The method of claim 20, wherein each of the plurality of differential signals is a Pulse Width Modulated (PWM) signal.

24. The method of claim 23, wherein each of the plurality of differential signals is to conform to the Mobile Industry Processor Interface (MIPI) M-PHY Specification.

* * * * *